US005783551A

United States Patent [19]

Mirsky

[11] Patent Number: 5,783,551
[45] Date of Patent: Jul. 21, 1998

[54] PARAFFINIC CLEANING SOLUTIONS

[76] Inventor: Jeffrey Mirsky, 8930 Ridgemont Dr., Atlanta, Ga. 30350

[21] Appl. No.: 675,357

[22] Filed: Jul. 2, 1996

Related U.S. Application Data

[63] Continuation of Ser. No. 296,089, Aug. 25, 1994, abandoned, which is a continuation of Ser. No. 875,979, Apr. 29, 1992, abandoned.

[51] Int. Cl.$^6$ ................... C11D 3/18; C11D 3/44
[52] U.S. Cl. ............ 510/407; 510/175; 510/112; 510/163; 510/417; 510/463; 252/364
[58] Field of Search .................... 252/162, 170, 252/364, 172; 510/175, 112, 163, 407, 417, 463

[56] References Cited

U.S. PATENT DOCUMENTS

| | | | |
|---|---|---|---|
| Re. 29,649 | 5/1978 | Farnsworth | 252/162 |
| 4,178,262 | 12/1979 | Compton et al. | 252/162 |
| 4,224,152 | 9/1980 | Lepain | 252/170 |
| 4,336,024 | 6/1982 | Denissenko et al. | 8/142 |
| 4,362,638 | 12/1982 | Caskey et al. | 252/90 |
| 4,504,406 | 3/1985 | Dhillon | 252/170 |
| 4,511,488 | 4/1985 | Matta | 252/162 |
| 4,640,719 | 2/1987 | Hayes et al. | 134/40 |
| 4,829,897 | 5/1989 | Wyman et al. | 252/537 |
| 4,906,303 | 3/1990 | Freij | 134/38 |
| 4,909,962 | 3/1990 | Clark | 252/171 |
| 4,919,839 | 4/1990 | Durbut et al. | 252/171 |
| 5,096,501 | 3/1992 | Dishart et al. | 252/170 |
| 5,145,523 | 9/1992 | Halpin et al. | 252/170 |
| 5,146,938 | 9/1992 | Lutener et al. | 252/162 |
| 5,188,754 | 2/1993 | Weltman et al. | 252/162 |
| 5,207,838 | 5/1993 | Googin et al. | 252/170 |
| 5,376,299 | 12/1994 | Russell et al. | 252/170 |
| 5,538,662 | 7/1996 | Klier et al. | 252/122 |

FOREIGN PATENT DOCUMENTS

| | | | |
|---|---|---|---|
| 699746 | 3/1996 | European Pat. Off. | |
| 61-125352 | 6/1986 | Japan . | |
| 62-32192 | 2/1987 | Japan . | |
| 3009999 | 1/1991 | Japan | 252/172 |
| 3-285997 | 12/1991 | Japan . | |
| 5-117691 | 5/1993 | Japan . | |
| 6-049494 | 2/1994 | Japan . | |

OTHER PUBLICATIONS

Mellan, I. *Industrial Solvents Handbook* Second Edition, Noyes Data Corporation, NJ 1977 No Month Available pp. 71, 358.

*Primary Examiner*—Douglas J. McGinty
*Attorney, Agent, or Firm*—Rohm & Monsanto

[57] ABSTRACT

A method for removing residues including waxes, oils, greases, resins, fluxes, diamond lapping compounds and solvent soluble resists from the surface of electronic components, optic elements, contact lenses and metals comprises the steps of contacting the surface with a solution consisting of from 60% to 100% of liquid n-paraffins, iso-paraffins or a mixture thereof having hydrocarbon chain lengths substantially in the range of from $C_9$ to $C_{16}$, from 0% to about 40% paraffin emulsifying agents and from 0% to about 25% d-limonene, allowing the solution to solubilize the residues and removing the solution from the surface.

12 Claims, No Drawings

PARAFFINIC CLEANING SOLUTIONS

This application is a continuation of application Ser. No. 08/296,089 filed on Aug. 25, 1994, now abandoned, as a continuation of application Ser. No. 07/875,979 filed on Mar. 29, 1992, now abandoned.

FIELD OF THE INVENTION

The present invention relates to paraffinic solutions and, more particularly, to the novel use of paraffinic solutions as cleaning solvents for optic elements and electronic components such as those used and produced by the electronics and photonics industries. Additionally, paraffinic solutions have been found to be extremely useful as cleaning solvents for diamond lapping compounds and in the manufacture of contact lenses.

BACKGROUND OF THE INVENTION

The photonics industry (composed from the words "photographic" and "electronic", the term here refers to the light emissions arts) currently uses or has used many different kinds of toxic and/or low flash point solvents for cleaning grease, oils, waxes, pitch, and other soluble solvent resists from optical elements and components. These solvents include toluene, xylene and halogenated hydrocarbons such as trichloroethylene and related solvents. However, due to their toxicity, these traditional solvents are accompanied by a host of problems regarding special handling requirements to protect employees in accordance with regulations promulgated by the Occupational Safety and Health Administration.

Additionally, these solvents can be hazardous to both the atmosphere, i.e., with respect to the acceleration of ozone depletion, and to our water supplies. This latter aspect requires the imposition of oppressive procedures on the relevant industries to guide the proper disposal of waste chemicals and thereby prevent the release of said chemicals into sewage systems and subsequently into the aquatic ecosystems.

Considerations similar to those discussed above also affect the electronics industry, as discussed in greater detail in U.S. Pat. No. 4,640,719 to Hayes et al. According to Hayes, the manufacture of printed circuit boards (hereinafter referred to as "PCB"s), requires the application of various substances, including rosin solder fluxes or water soluble fluxes and tape adhesives, to the substrate board material during different stages of the process. After the respective stages have been completed, the residues of rosin fluxes, adhesives and the like have traditionally been removed by washing in a solvent such as 1,1,1,-trichloroethane, trichloromonofluoromethane, methylene chloride, trichlorotrifluoroethane, or mixtures or azeotropes of these solvents. These solvents are toxic and teratogenic to some extent, requiring special containment procedures to safeguard handlers. Furthermore, the solvents are not easily disposable since they are environmentally harmful.

The water-soluble fluxes are washable with warm soapy water, consequently the solvent, i.e. water, does not pose the same kind of environmental and occupational hazards that the organic solvents present. However, because the water-soluble fluxes are highly corrosive they can cause premature circuit failure if not thoroughly washed away. For this reason, rosin flux is preferred for many electronics applications.

Hayes et al. have disclosed that terpene compounds in combination with emulsifying surfactants may be useful for cleaning rosin soldering flux and adhesive tape residues. Hayes et al. further disclose that a minimum concentration of 60% terpene compounds, primarily limonene, is desirable and that 90% limonene combined with 10% of various emulsifying surfactants is preferable. However, the terpene compositions disclosed by Hayes et al. suffer from several disadvantages.

Reliance on compositions employing such terpene compounds as limonene, pinene, gamma-terpinene and dipentene is disadvantageous in that they have been shown to be toxic when released into aquatic ecosystems. Furthermore, terpenes are primarily derivatives of natural essential oils distilled from various herbaceous sources leads to certain unique difficulties not experienced with certain organic solvents. Natural derivatives are typically more costly to produce. Additionally, the quality and cost of natural derivatives is subject to fluctuations caused by such factors as weather and soil conditions. For example, poor rainfall may lead to reduced crop yields and subsequent higher pricing, as well as causing inconsistencies in essential oil compositions. More specifically, levels and the quality of d-limonene in the source will fluctuate with varying weather conditions.

Cleaning solvents derived from essential oils also suffer from the disadvantage that they may leave a film or other unacceptable residue if used for the cleaning of optic elements. This residue is essentially comprised of lower evaporation rate components entrained in the original distillation of the citrus oils. Furthermore, most terpene compounds have an odor that is found by workers to be quite overpowering and disagreeable to work with in the concentrations required by most applications as disclosed by Hayes et al.

An additional disadvantage found with citrus-derived d-limonene cleaning compounds lies in the conductivity thereof. It can be shown that an aqueous extraction of commercial d-limonene with an equal volume of water has a conductivity from about 25 μmho to about 100 μmho. It has been proposed that this is due to citric acid and other conductive compounds which cannot practically be eliminated from citrine essential oil extracts. This residual acidity can etch or otherwise attack or corrode metal or soft glass surfaces and it is difficult to eliminate these effects completely. Therefore, components treated with terpenic solvents are prone to long-term failure.

U.S. Pat. No. 4,511,488 to Matta discloses d-limonene based aqueous cleaning compositions comprising mixing d-limonene with a surfactant in the presence of a coupling agent, such as glycol or glycol ether, and water. Matta further discloses that increased flash point is a desirable characteristic of a cleaning solution for degreasing. However, the solutions described by Matta suffer from many of the disadvantages discussed above, including toxicity and residual acidity.

In the photographic, electronic and optics industries, there is a similar if not greater need for cleaning solutions which will effectively remove wax, oils, pitch, flux, resin, resist and the like without affecting metal or metal alloys and without etching or staining glass. Additionally, a suitable cleaning solution will have a flash point in excess of 100° F. (TCC) so that it may be designated as "combustible" rather than "flammable". Typically, solutions such as toluene, xylene and halogenated hydrocarbons such as trichloroethylene (TCE) have been relied upon. However, these solutions suffer from the disadvantages described above with regards to their disposability and handling safety. In particular, chlorofluorocarbons are commonly used to clean contact lenses in their manufacturing process. It is important in this process that no harmful residue remain on the contact lenses. As will be discussed hereinbelow, paraffins can be distilled which will satisfy the requirements of complete evaporation without incurring the environmental hazards associated with chlorofluorocarbons.

It is of course highly desirable that use of an optics cleaning solution result in a clean surface that has as little residue remaining as possible. It is also highly desirable that the solution leave no film or deposits on the surface upon drying. The cleaning solutions disclosed by Hayes et al. and Matta have bases with concentrations on the order of 60% to 100% of essential oils, such as d-limonene, terpinene and pinene, in combination with surfactants, coupling agents and other additives. These formulations can leave an undesirable residue on an optic surface which decreases their utility. Cleaning solutions which rely on d-limonene suffer from the problem that d-limonene is typically ½% residue by volume. Therefore, a 100 ml. sample of d-limonene will upon evaporation leave deposits of at least 5000 p.p.m. or about 0.5 grams. The fact that the terpenes are naturally derived and have inherent inconsistencies from one batch to the next only adds to difficulties in attempting to control the composition content and thereby reduce residue and deposits. Additionally, oxidized d-limonene is one essential oil component which is known to cause allergic sensitization among workers and therefore one to which exposure should be limited.

Organic compounds are also commonly used as cleaning solutions to remove lapping compound from lap-polished surfaces. Typically, kerosene is used to remove the lapping compound or paste. however, as discussed hereinabove, environmental and safety considerations discourage the continued use of such harmful organic cleaning solutions. As with photonics, it is very important that any substitute for the currently used harmful organic cleaning solutions have a high flash point, leave little or no residue, be non-toxic and be environmentally harmless and therefore sink disposable.

OBJECTS AND SUMMARY OF THE INVENTION

It is therefore an object of the present invention to provide a composition which is useful for cleaning waxes, oils, greases, flux, lapping compounds, resin, resist and the like from the surfaces of metal, electronic and optical components and a method for using the solution.

It is also an object of the present invention to provide a cleaning composition and method for using the composition which has a reduced environmental impact.

It is another object of the present invention to provide a cleaning composition and method for using the composition which is toxicologically safer for industrial workers.

It is still another object of the present invention to provide a cleaning composition and method for using the composition which presents a reduced risk of injury to workers due to decreased flammability.

It is a further object of the present invention to provide a cleaning composition and method for using the composition which leaves virtually no residue on the surfaces of metal, electronic and optical components.

The above objectives and others not specifically enumerated are accomplished by the present invention which provides a solution essentially comprising at least 60% highly saturated paraffins and/or isoparaffins having hydrocarbon chain lengths of from about nine (9) to fourteen (14) carbon atoms ($C_9$–$C_{14}$), from 0% to about 25% d-limonene and from about 0% to 40% surfactant. The solution is applied by immersion or spraying onto the surfaces which are to be cleaned. The solution is allowed to remain on until the surface contaminants are solubilized. Subsequently, the solution is removed either by rinsing or by accelerated evaporation.

The above and other objects, features and advantages of the present invention will become readily apparent from the following detailed description.

DETAILED DESCRIPTION OF THE PREFERRED EMBODIMENTS

One exemplary embodiment of a cleaning solution in accordance with the present invention is essentially comprised of from 60% to about 100% by weight of liquid paraffins and/or isoparaffins. The paraffins and isoparaffins will mostly range in molecular weight from about 120 to about 191, depending on the extent of branching and level of saturation. Typically, the degree of saturation will be high and there will be minimal branching, although these are factors which may be adjusted as desired to produce cleaning solutions having slightly differing evaporative and solubilizing properties. The balance of the cleaning solution is substantially comprised of a surfactant at from 0% to 40% by weight and d-limonene at from 0% to 25% by weight.

Certain preferred concentrations, including those described in the Examples below, are typically those which result in a composition having a flash point of from 45° F. to about 150° F. The concentration of n-paraffin and/or isoparaffins will for most applications be higher than 90% and often as high as 98%. D-limonene, which is present in relatively small amounts will usually be in concentrations of 10% or less, with 2% being preferable. Surfactants, such as sodium dodecyl sulfate and fatty alcohol ethoxylate are present in amounts which is usually 10% or less, with 8% being preferable.

The d-limonene, which is a solvent in its own right, is usually present only in amounts large enough to impart a slight citrus odor and yet sufficiently small to prevent the manifestation of the disadvantages inherent with a naturally derived essential oil component. It has been discovered that some applications require the presence of d-limonene in minimal amounts for the system to function effectively. This is especially so when more hydrophobic solvents are preferred such as with the removal of pitch from lenses or with cleaning of diamond-lapping compounds. Apparently, the d-limonene acts synergistically with the paraffins in that a certain threshhold level of d-limonene is needed to make an effective paraffin-based cleaning system. However, the addition of excess d-limonene will not increase the efficiency of the system and can in fact be detrimental to the quality of the cleansing action.

Another exemplary embodiment of a cleaning agent produced in accordance with the present invention essentially comprises from 30% to about 70% of an n-paraffin or an iso-paraffin, from 10% to about 50% water, from 0% to about 20% of a surfactant and from 0% to about 20% of a coupling agent. Such a cleaning agent is useful for cleaning more hydrophilic materials such as water-soluble fluxes, for example.

EXAMPLES

The exemplary formulations below include numerous surfactants which are suitable for the emulsification of the alkyl components of the present invention. Surfactants which may be employed include but are not limited to the following: ethoxylated alkyl phenols, alkyl benzene sulfonates and linear or branched alcohol ethoxylates.

The combination of surfactants and $C_9$ to $C_{16}$ compounds emulsify hydrophilic contaminants while the $C_9$ to $C_{16}$ alkanes contemporaneously solvate hydrophobic substances.

Example 1

An industrial cleaner suitable for use in degreasing metal surfaces in place of trichloroethane is composed as follows:

| | |
|---|---|
| Tetradecane | 63.3% |
| Sodium dodecyl sulfate | 6.0% |
| Sodiuim metasiliate | .5% |
| Water | 30.2% |

Example 2

The surfaces of lenses to be coated must be completely free of residue in order to ensure uniform coating, i.e., without pitting or voids. Fingerprint marks, oil, grease, or even residue of the cleaning solvent itself can interfere with the integrity of the coated surface. The following formula evaporates quickly, cleans effectively and leaves no residue on evaporation.

| | |
|---|---|
| Dodecane | 12.5% |
| Tetradecane | 65.1% |
| Hexadecane | 32.4 |

A 100 ml. sample of the above solution was evaporated in a tared petri dish and upon complete evaporation, the weight of the petri dish had not even increased as much as 1 mg. Therefore, less than 10 p.p.m. of residues were deposited. Typically, a lens or other optic element would be contacted with such a solution and be allowed to air dry in one half hour or less.

Example 3

A biodegradable, nontoxic, non flammable cleaning solution suitable for removing flux from printed circuit boards may be formulated as follows:

| | |
|---|---|
| Hexadecane | 38.0% |
| Fatty alcohol ethoxylate | 4.8% |
| EDTA sodium salt | 0.6% |
| Ethanol | 12.0% |
| Water | 44.4% |

The aqueous elution of a printed circuit board treated with the above formulation exhibited a conductivity of less than 5 µmho and no pH change was detected. Therefore, it may be concluded that no residual corrosivity remained thereon.

Example 4

When zero residue cleaning is required, finely distilled ranges of single alkanes or mixtures within the range of $C_9$ to $C_{16}$ may be employed which will evaporate completely leaving no detectable residue. Mixtures may be selected depending upon the nature of the substance to be removed and the means of removal employed. For example, hexadecane may be employed in vapor degreasers operated below the flash point of 275° F. The vapor pressure thereof at a temperature of 100° F. is, for example, suitably high in such devices to act to clean parts by a reflux of the liquid vapor phases.

It should be understood that the embodiments and formulations described herein are merely exemplary and that a person skilled in the art may make many variations and modifications without departing from the spirit and scope of the invention. All such modifications and variations are intended to be included within the scope of the invention as defined in the appended claims.

What I claim is:

1. A cleaning agent consisting of a solution of from about 60% to 100% by weight of n-paraffins, wherein said n-paraffins have hydrocarbon lengths substantially in the range of from about $C_9$ to $C_{16}$, from about 2% to 25% by weight of at least one terpene, and optionally at least one n-paraffin emulsifying agent.

2. A cleaning agent in accordance with claim 1, wherein said terpene is selected from the group consisting of the d-form of limonene, α-pinene, β-pinene, terpinene and dipentene.

3. A cleaning agent in accordance with claim 1, wherein said solution has a flash point in the range of from 40° F. to about 150° F.

4. A cleaning agent consisting of a solution of from about 60% to 100% by weight of a mixture of n-paraffins and iso-paraffins, wherein said n-paraffins and iso-paraffins have hydrocarbon lengths substantially in the range of from $C_9$ to $C_{16}$, from about 2% to 25% by weight of at least one terpene, and optionally at least one n-paraffin and iso-paraffin emulsifying agent.

5. A cleaning agent in accordance with claim 1, wherein said n-paraffins are selected from the group of alkanes consisting of nonanes, decanes, undecanes, dodecanes, tridecanes, tetradecanes, pentadecanes and hexadecanes.

6. A cleaning agent in accordance with claim 4, wherein said terpene is selected from the group consisting of the d-form of limonene, α-pinene, β-pinene, terpinene and dipentene.

7. A cleaning agent in accordance with claim 4, wherein said solution has a flash point in the range of from 40° F. to about 150° F.

8. A cleaning agent consisting of a solution of from about 60% to 100% by weight of iso-paraffins, wherein said iso-paraffins have hydrocarbon lengths substantially in the range of from $C_9$ to $C_{16}$, from about 2% to 25% by weight of at least one terpene, and optionally at least one iso-paraffin emulsifying agent.

9. A cleaning agent in accordance with claim 8, wherein said terpene is selected from the group consisting of the d-form of limonene, α-pinene, β-pinene, terpinene and dipentene.

10. A cleaning agent in accordance with claim 8, wherein said solution has a flash point in the range of from 40° F. to about 150° F.

11. A cleaning agent in accordance with claim 4, wherein said n-paraffins and said iso-paraffins are selected from the group of alkanes consisting of nonanes, decanes, undecanes, dodecanes, tridecanes, tetradecanes, pentadecanes and hexadecanes.

12. A cleaning agent in accordance with claim 8, wherein said iso-paraffins are selected from the group of alkanes consisting of nonanes, decanes, undecanes, dodecanes, tridecanes, tetradecanes, pentadecances and hexadecanes.

\* \* \* \* \*